US008614661B2

(12) United States Patent
Tan et al.

(10) Patent No.: US 8,614,661 B2
(45) Date of Patent: Dec. 24, 2013

(54) SHIFT REGISTER UNIT, GATE DRIVING DEVICE AND LIQUID CRYSTAL DISPLAY

(75) Inventors: Wen Tan, Beijing (CN); Xiaojing Qi, Beijing (CN); Weiyun Huang, Beijing (CN)

(73) Assignees: Boe Technology Group Co., Ltd., Beijing (CN); Chengdu Boe Optoelectronics Technology Co., Ltd., Chengdu (CN)

( * ) Notice: Subject to any disclaimer, the term of this patent is extended or adjusted under 35 U.S.C. 154(b) by 238 days.

(21) Appl. No.: 13/284,191

(22) Filed: Oct. 28, 2011

(65) Prior Publication Data

US 2012/0105397 A1 May 3, 2012

(30) Foreign Application Priority Data

Oct. 29, 2010 (CN) .......................... 2010 1 0532020

(51) Int. Cl.
*G09G 3/36* (2006.01)
*G11C 19/28* (2006.01)

(52) U.S. Cl.
USPC ............................................. 345/100; 377/64

(58) Field of Classification Search
None
See application file for complete search history.

(56) References Cited

U.S. PATENT DOCUMENTS 7,825,888 B2 * 11/2010 Tobita et al. .................. 345/100
8,306,177 B2 * 11/2012 Lee et al. ........................ 377/64
8,373,638 B2 * 2/2013 Jang et al. ..................... 345/100
2007/0171115 A1 7/2007 Kim et al.
2008/0080661 A1 4/2008 Tobita
2008/0219401 A1 9/2008 Tobita
2009/0058790 A1 3/2009 Chiang et al.

FOREIGN PATENT DOCUMENTS

CN 101221818 A 7/2008
CN 101377956 A 3/2009
KR 20070074826 A 7/2007

OTHER PUBLICATIONS

Chinese First Office Action dated Feb. 4, 2013; Appln. No. 201010532020.5.
KIPO NOA dated Jun. 13, 2013; Appln. No. 10-2011-0111336.

* cited by examiner

*Primary Examiner* — Joseph Haley
(74) *Attorney, Agent, or Firm* — Ladas & Parry LLP

(57) ABSTRACT

The present invention provides a shift register unit, a gate driving device and a liquid crystal display, wherein the shift register unit includes five thin film transistors. The drain of a first thin film transistor is connected to a first clock signal input terminal; the drain of a third thin film transistor is connected to the first clock signal input terminal, the gate thereof is connected to the gate of the first thin film transistor, and the source thereof is connected to a second signal output terminal. The shift register unit, the gate driving device and the liquid crystal display provided by the present invention separate the gate driving signal and the control signal for controlling the next neighboring shift register unit from each other, which can solve the problem that the accuracy of the gate driving signal is low due to the delay accumulation.

10 Claims, 7 Drawing Sheets

SHIFT REGISTER UNIT, GATE DRIVING DEVICE AND LIQUID CRYSTAL DISPLAY

FIELD OF THE INVENTION

Embodiments of the present invention relate to the field of driving technology, especially to a shift register unit, a gate driving device and a liquid crystal display.

BACKGROUND OF THE INVENTION

In Thin Film Transistor Liquid Crystal Display (TFT-LCD for short), usually, gates of respective thin film transistors (TFT) of a pixel area are provided with gate driving signals via a gate driving device. The gate driving device may be formed on the array substrate of a liquid crystal display (LCD) by an array process, and such technology is also referred to as Gate on Array (GOA for short) technology.

A LCD gate driving device formed by using the GOA technology includes multiple shift register units and one shifting register unit outputs one gate driving signal. The shift register units are required to be connected to the gate lines of a pixel area which means the display area of a LCD and includes multiple sub-pixels. There are loads on the gate lines of the pixel area and the loads on the gate lines will result in the delay in the gate driving signal output by the shift register unit.

In a gate driving device in the prior art, in addition to the need of driving the gate lines, the gate driving signal output by one shift register unit needs to be input to the next neighboring shift register unit as a control signal for the next neighboring shift register unit (for example, as a frame start signal for the next neighboring shift register unit). In this way, the gate driving signal generated by the next neighboring shift register unit will result in a larger delay. It can be derived that one kind of delay accumulation occurs between respective shift register units equivalently, thus resulting in the accuracy of the gate driving signals output by the gate driving device being reduced.

SUMMARY OF THE INVENTION

The present invention provides a shift register unit, a gate driving device and a liquid crystal display for solving the problem in the prior art that the accuracy of the gate driving signal output by the gate driving device is low due to the delay accumulation.

The embodiment of the present invention provides a shift register unit, comprising:

a first thin film transistor, the drain of which is connected to a first clock signal input terminal and the source of which is connected to a first signal output terminal;

a second thin film transistor, the drain of which is connected to the first signal output terminal, the gate of which is connected to a reset signal input terminal, and the source of which is connected to a low level signal input terminal;

a third thin film transistor, the drain of which is connected to the first clock signal input terminal, the gate of which is connected to the gate of the first thin film transistor, and the source of which is connected to a second signal output terminal;

a fourth thin film transistor, the drain of which is connected to the drain of the third thin film transistor, the gate of which is connected to a second clock signal input terminal, and the source of which is connected to the low level signal input terminal;

a fifth thin film transistor, the gate and the drain of which are both connected to a start signal input terminal, and the source of which is connected to the gate of the first thin film transistor; and a capacitor, two terminals of which are connected to the gate and the source of the first thin film transistor respectively;

the first clock signal input terminal is used for inputting a clock signal; the second clock signal input terminal is used for inputting a clock signal inverted with respect to the signal input by the first clock signal; the reset signal input terminal is used for inputting a reset signal; the start signal input terminal is used for inputting a start signal; the low level signal input terminal is used for inputting a low level signal; the first signal output terminal is used for outputting a gate driving signal; and the second signal output terminal is used for providing a control signal for the next neighboring shift register unit.

The embodiment of the present invention further provides a liquid crystal display gate driving device, comprising n shift register units sequentially connected as described above, wherein n is a natural number;

except for the first shift register unit and the n-th shift register unit, the second signal output terminal of each shift register unit is connected to the reset signal input terminal of the last neighboring shift register unit and the start signal input terminal of the next neighboring shift register unit;

the second signal output terminal of the first shift register unit is connected to the start signal input terminal of the second shift register unit; and the second signal output terminal of the final shift register unit is connected to the reset signal input terminal of the (n−1)-th shift register unit and the reset signal input terminal of itself.

The embodiment of the present invention further provides a liquid crystal display comprising the liquid crystal display gate driving device as described above.

In the shift register unit, the gate driving device and the liquid crystal display provided by the embodiment of the present invention, the gate of the first thin film transistor and the gate of the third thin film transistor are both connected to the source of the fifth thin film transistor, the drain of the first thin film transistor and the source of the third thin film transistor are both connected to the first clock signal input terminal, the drain of the third thin film transistor is connected to the second signal output terminal, and the source of the first thin film transistor is connected to the first signal output terminal. Such a connection relationship may assure that the signal output by the first signal output terminal is roughly the same with the signal output by the second signal output terminal, and since the second signal output terminal is not connected to the gate line of the pixel area, it will not be affected by the load of the pixel area, and the signal output by the second signal output terminal has a smaller delay than that of the signal output by the first signal output terminal. Using the signal output by the second signal output terminal as the control signal required by the next neighboring shift register unit, the problem that the accuracy of the gate driving signal output by the gate driving device is low due to the delay accumulation can be solved and the accuracy of the gate driving signal can be improved.

BRIEF DESCRIPTION OF THE DRAWINGS

In order to illustrate embodiments of the present invention or technical solutions in the prior art more clearly, a brief introduction will be made to attached drawings needed to be used in the description of the embodiments or the prior art in the following. Obviously, the attached drawings in the following description are some embodiments of the present invention, and for those of ordinary skill in the art, other attached drawings may be obtained according to these attached drawings without inventive efforts.

DESCRIPTION OF THE PREFERRED EMBODIMENTS

In order to make the object, technical solutions and advantages of embodiments of the present invention more clear, the technical solutions in the embodiments of the present invention will be described clearly and thoroughly in combination with the attached drawings in the embodiments of the present invention. Obviously, the described embodiments are a part of embodiments of the present invention and are not all of the embodiments. Based on the embodiments of the present invention, all of other embodiments obtained by those of ordinary skill in the art without inventive efforts belong to the protection scope of the present invention.

Figure 1:
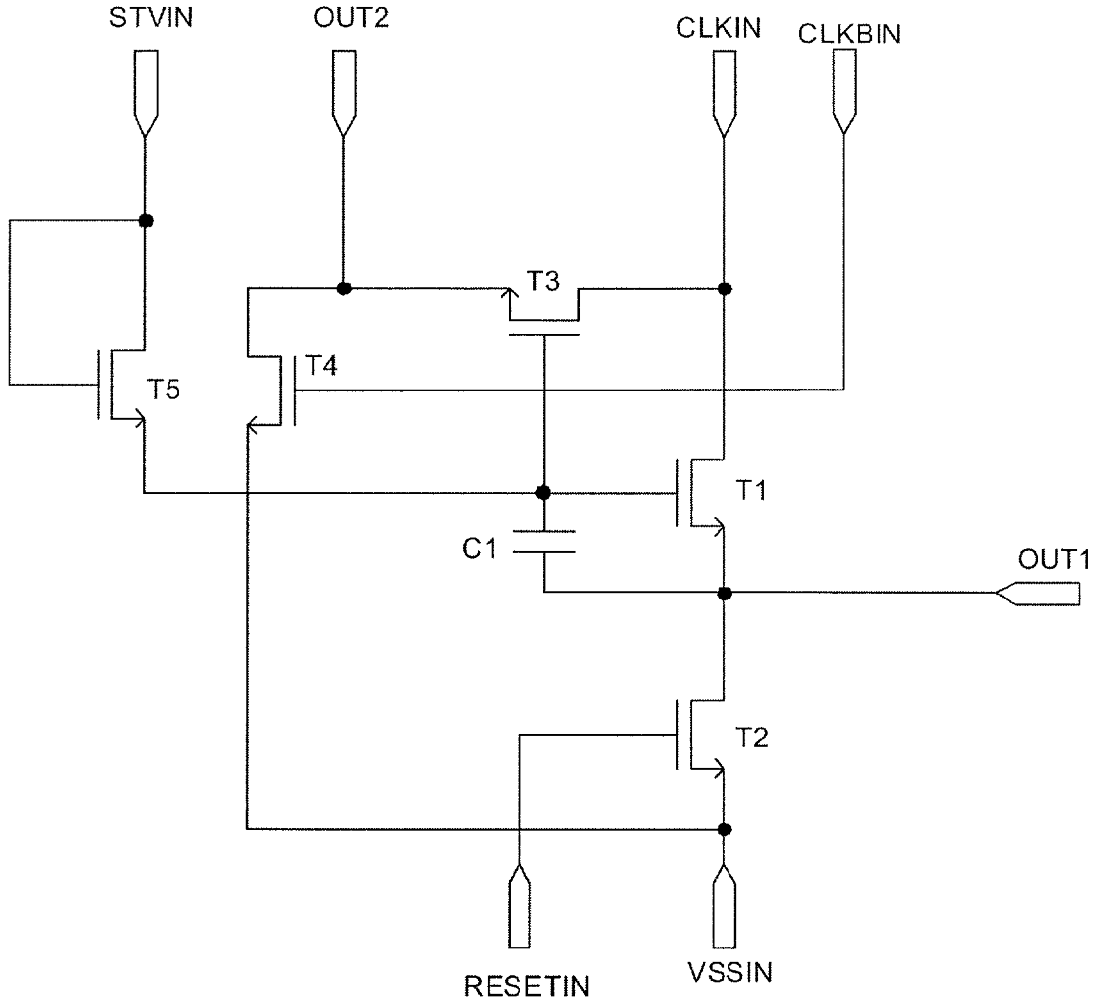
FIG. 1 is a structural schematic diagram for a first embodiment of a shift register unit of the present invention.

FIG. 1 is a structural schematic diagram for a first embodiment of a shift register unit of the present invention. The shift register unit includes a first TFT T1, a second TFT T2, a third TFT T3, a fourth TFT T4, a fifth TFT T5 and a capacitor C1.

The drain of the first TFT T1 is connected to a first clock signal input terminal (CLKIN), and the source thereof is connected to a first signal output terminal (OUT1).

The drain of the second TFT T2 is connected to the first signal output terminal (OUT1), the gate thereof is connected to a reset signal input terminal (RESETIN), and the source thereof is connected to a low level signal input terminal (VSSIN).

The drain of the third TFT T3 is connected to a first clock signal input terminal (CLKIN), the gate thereof is connected to the gate of the first TFT T1, and the source thereof is connected to a second signal output terminal (OUT2).

The drain of the fourth TFT T4 is connected to the drain of the third TFT T3, the gate thereof is connected to a second clock signal input terminal (CLKBIN), and the source thereof is connected to the low level signal input terminal (VSSIN).

The gate and drain of the fifth TFT T5 are both connected to a start signal input terminal (STVIN) and the source thereof is connected to the gate of the first TFT T1.

The two terminals of the capacitor C1 are connected to the gate and the source of the first TFT T1 respectively.

Wherein, the first clock signal input terminal (CLKIN) is used to input a clock signal. The second clock signal input terminal (CLKBIN) is used to input a clock signal inverted with respect to the signal input by the first clock signal input terminal. The reset signal input terminal (RESETIN) is used to input a reset signal. The start signal input terminal (STVIN) is used to input a frame start signal. The low level signal input terminal (VSSIN) is used to input a signal of a low level. The first signal output terminal (OUT1) is used to output a gate driving signal. The second signal output terminal (OUT2) is used to provide a control signal to the next neighboring shift register unit.

The shift register unit provided by the first embodiment of the present invention includes the first signal output terminal and the second signal output terminal, and the first signal output terminal is used for outputting the gate driving signal, that is, the first signal output terminal is connected to a gate line of a pixel area. The second signal output terminal is used to provide the control signal to the next neighboring shift register unit. The control signal required by the next neighboring shift register unit may include the reset signal and the frame start signal, and the gate driving signal output by the last neighboring shift register unit may function as the control signal for the next neighboring shift register unit.

In the first embodiment, the gates of the first TFT T1 and the third TFT T3 are both connected to the source of the fifth TFT T5, the drain of the first TFT T1 and the source of the third TFT T3 are both connected to the first clock signal input terminal, the drain of the third TFT T3 is connected to the second signal output terminal, and the source of the first TFT T1 is connected to the first signal output terminal. Such a connection manner may assure that the signal output by the first signal output terminal is roughly the same with the signal output by the second signal output terminal, and since the second signal output terminal is not connected to the gate line of the pixel area, it will not be affected by the load of the pixel area, and the signal output by the second signal output terminal has a smaller delay than that of the signal output by the first signal output terminal. Using the signal output by the second signal output terminal as the control signal required by the next neighboring shift register unit, the problem that the accuracy of the gate driving signal output by the gate driving device is low due to the delay accumulation can be solved, and the accuracy of the gate driving signal can be improved.

The shift register unit provided by the first embodiment is in fact to separate the control signal and the gate driving signal generated by the shift register unit from each other. The gate driving signal is only used for driving the gate line, and the function of controlling the next neighboring shift register unit to generate the gate driving signal is realized by the signal output by the second signal output terminal, unlike the prior art that the gate driving signal generated by one signal output terminal is used for not only driving the gate line but also controlling the next neighboring shift register unit to generate the gate driving signal.

Figure 2:
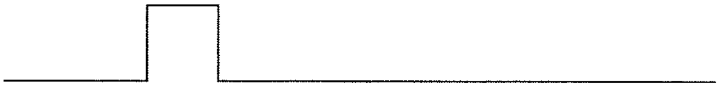
FIG. 2 is a schematic diagram for a gate driving signal generated by the shift register unit as shown in FIG. 1.

FIG. 2 is a schematic diagram for a gate driving signal generated by the shift register unit as shown in FIG. 1. For a LCD, when it is required to control one row of gate lines to be turned on, the gate driving signals output by the shift register units connected to the row of gate lines are at high levels; and when it is required to control the row of gate lines to be turned off the gate driving signals output by the shift register units connected to the row of gate lines are at low levels. If the LCD employs a manner of line-by-line scanning, it is assumed that there are “a” rows of gate lines, and the display for one frame of the LCD is T, then the time when the gate driving signal keeps at a high level is T/a.

However, the gate driving signal output by a first signal output terminal may also change to a high level at the stage of being needed to keep at a low level, due to the influence of the clock signal, thereby influencing the normal display of the LCD. Taking FIG. 1 as an example, the drain of the first TFT T1 is connected to the first clock signal input terminal, and the signal input by the first clock signal input terminal (CLKIN) may still change to a high level at the stage of the gate driving signal being needed to keep at a low level, and the signal input by the first clock signal input terminal (CLKIN) changing to a high level possibly results in the gate driving signal changing to a high level as well. Although the second TFT may function so as to pull the level of the gate driving signal down, the second TFT plays a role of pulling the level down only when the signal input by the reset signal input terminal (RESETIN) is at the high level, and when the second TFT is turned off, it fails to assure that the gate driving signal keeps at the low level reliably.

Figure 3:
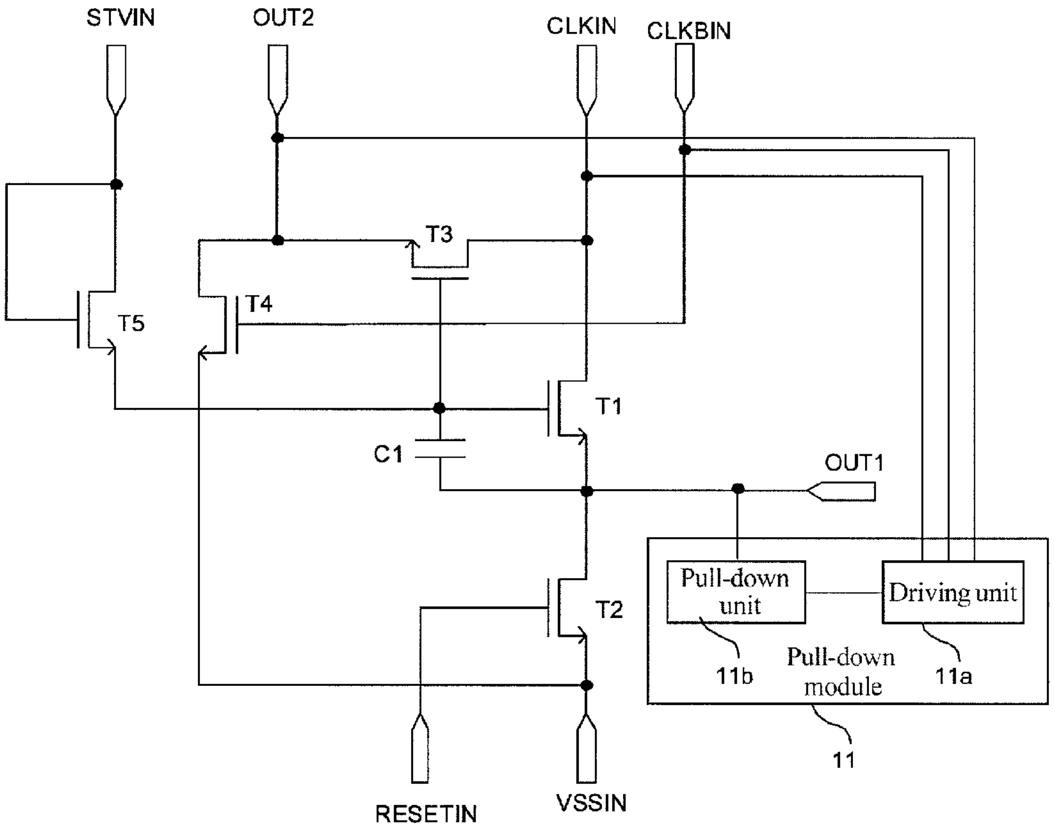
FIG. 3 is a structural schematic diagram for a second embodiment of a shift register unit of the present invention.

FIG. 3 is a structural schematic diagram for a second embodiment of a shift register unit of the present invention. The embodiment adds a pull-down module 11 on the basis of the first embodiment, which is connected to the first signal output terminal (OUT1) and is used for pulling the level of the gate driving signal down to a low level at the stage of the gate driving signal being needed to keep at a low level.

Wherein, the pull-down module 11 may include a driving unit 11*a* and a pull-down unit 11*b*, wherein the driving unit 11*a* may be connected to the first clock signal input terminal (CLKIN), the second clock signal input terminal (CLKBIN) and the second signal output terminal (OUT2) and be used for driving the pull-down unit to operate at the stage of the gate driving signal being needed to keep at a low level; and the pull-down unit 11*b* is connected to the driving unit 11*a* and the first signal output terminal (OUT1) and is used for pulling the gate driving signal output by the first signal output terminal (OUT1) down to a low level under the control of the driving unit 11*a*.

Figure 4:
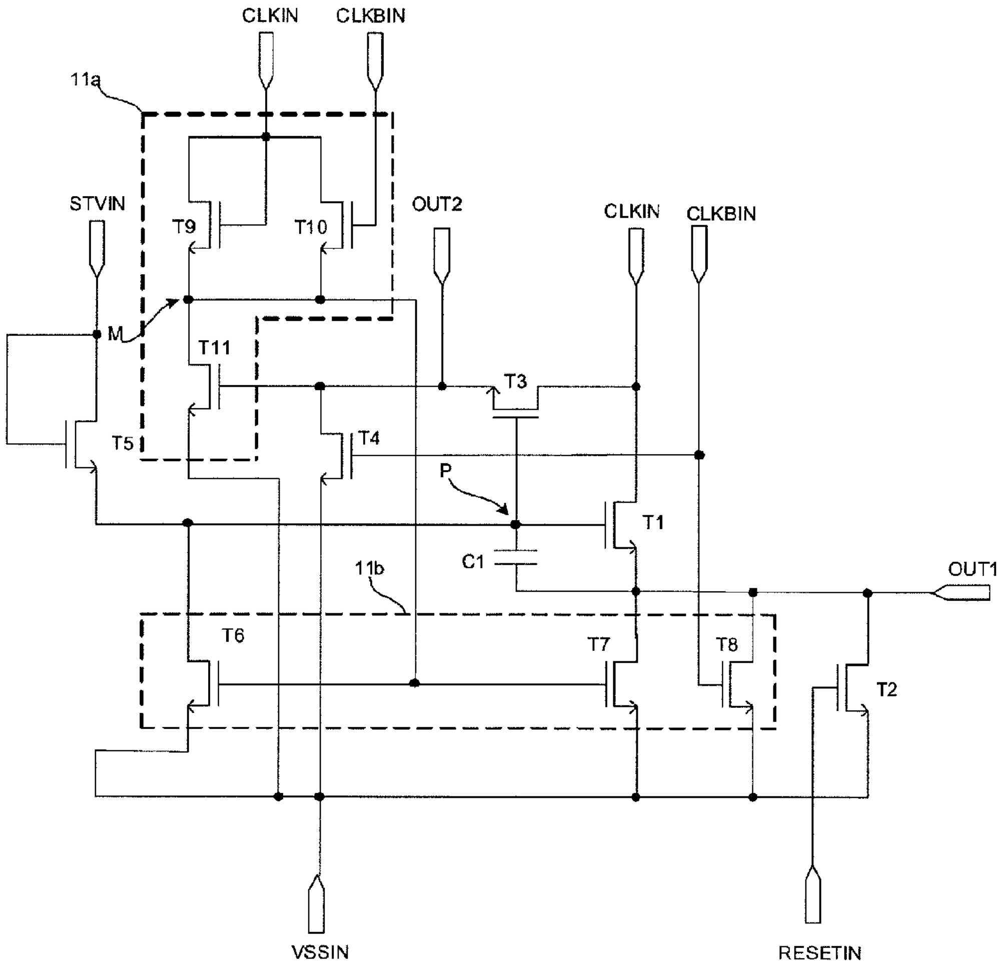
FIG. 4 is a structural schematic diagram for a third embodiment of a shift register unit of the present invention.

FIG. 4 is a structural schematic diagram for a third embodiment of a shift register unit of the present invention. In the embodiment, the driving unit 11*a* includes a ninth TFT T9, the tenth TFT T10 and an eleventh TFT T11. The drain and gate of the ninth TFT T9 are connected to the first clock signal input terminal (CLKIN). The drain of the tenth TFT T10 is connected to the first clock signal input terminal (CLKIN), the gate thereof is connected to the second clock signal input terminal (CLKBIN), and the source thereof is connected to the source of the ninth TFT T9. The drain of the eleventh TFT T11 is connected to the source of the ninth TFT T9 and the source of the tenth TFT T10, the gate thereof is connected to the source of the third TFT T3, and the source thereof is connected to the low level signal input terminal (VSSIN).

The pull-down unit 11*b* includes a sixth TFT T6, a seventh TFT T7 and an eighth TFT T8. The drain of the sixth TFT T6 is connected to the source of the fifth TFT T5, the gate thereof is connected to the source of the ninth TFT T9, and the source thereof is connected to the low level signal input terminal (VSSIN). The drain of the seventh TFT T7 is connected to the first signal output terminal (OUT1), the gate thereof is connected to the source of the ninth TFT T9, and the source thereof is connected to the low level signal input terminal (VSSIN). The drain of the eighth TFT T8 is connected to the first signal output terminal (OUT1), the gate thereof is connected to the second clock signal input terminal (CLKBIN), and the source thereof is connected to the low level signal input terminal (VSSIN).

Figure 5:
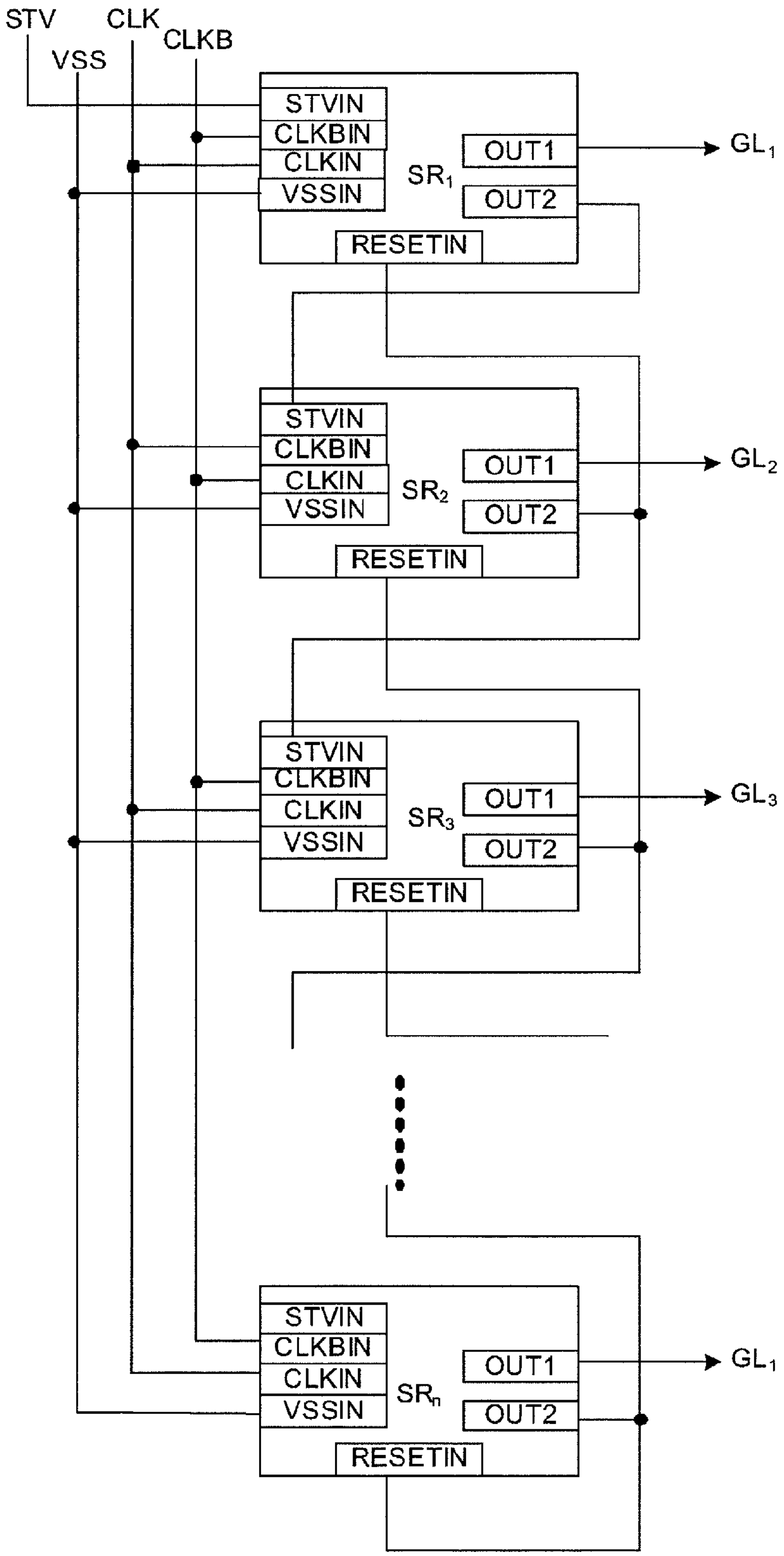
FIG. 5 is a structural schematic diagram for a LCD gate driving device of the present invention.

FIG. 5 is a structural schematic diagram for a LCD gate driving device of the present invention, wherein the device includes n shift register units sequentially connected as shown in the respective embodiments as described above in which n is a natural number. Respective shift register units are marked with $SR_1$, $SR_2$, . . . , $SR_n$ respectively.

Except for the first shift register unit $SR_1$ and the n-th shift register unit $SR_n$, the second signal output terminal (OUT2) of each shift register unit is connected to the reset signal input terminal (RESETIN) of the last neighboring shift register unit and the start signal input terminal (STVIN) of the next neighboring shift register unit.

The second signal output terminal (OUT2) of the first shift register unit $SR_1$ is connected to the start signal input terminal (STVIN) of the second shift register unit.

The second signal output terminal (OUT2) of the final shift register unit $SR_n$ is connected to the reset signal input terminal (RESETIN) of the (n−1)-th shift register unit and the reset signal input terminal (RESETIN) of itself.

The gate driving signals outputs by respective shift register units are marked with $GL_1$, $GL_2$, . . . , $GL_n$ respectively.

The connection relationship of respective shift register units in the gate driving device provided by the present invention can be seen clearly in combination with FIG. 5 and respective embodiments for shift register units as described above. In the following, the timing relationship between the input and output signals in a single shift register unit as well as the timing relationship between the input and output signals in a LCD gate driving device are introduced.

Figure 6:
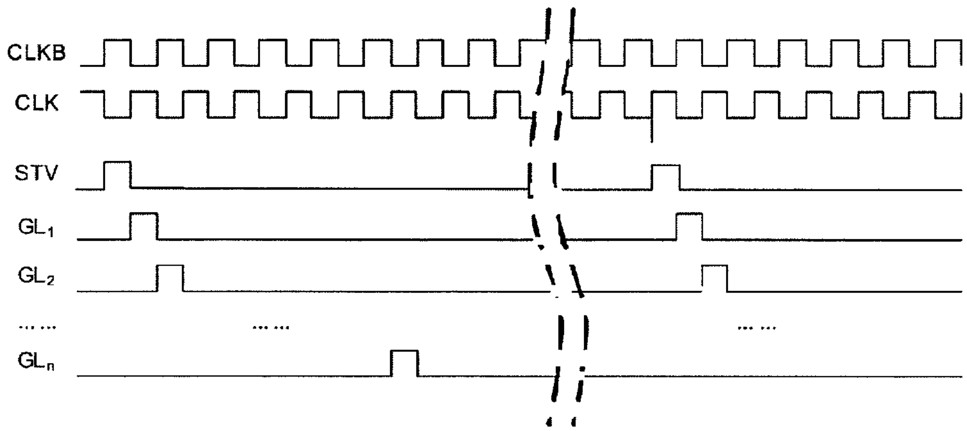
FIG. 6 is a timing chart for the input and output signals of the LCD gate driving device as shown in FIG. 5.

FIG. 6 is a timing chart for the input and output signals of the LCD gate driving device shown in FIG. 5. STV is a frame start signal which is input to the start signal input terminal (STVIN) of the first shift register unit $SR_1$, and the start signal input terminals (STVINs) of the rest shift register units are all connected to the second signal output terminals (OUT2s) of the last neighboring shift register units, that is, the input to the start signal input terminals (STVINs) of the rest shift register units are the signals output by the second signal output terminals (OUT2s) of the last neighboring shift register units. The signal output by the second signal output terminal (OUT2) of one shift register unit functions as the frame start signal for the next neighboring shift register unit.

The first signal output terminal (OUT1) of each shift register unit outputs one gate driving signal for driving one row of gate lines of the LCD.

A low level signal (VSS) (Vss is not shown in FIG. 6) is input to the low level signal input terminal (VSSIN) of each shift register unit.

For the odd numbered shift register unit, the first clock signal input terminal (CLKIN) thereof is used to input a first clock signal (CLK), and the second clock signal input terminal (CLKBIN) thereof is used to input a second clock signal (CLKB). For the even numbered shift register unit, the first clock signal input terminal (CLKIN) thereof is used to input the second clock signal (CLKB), and the second clock signal input terminal (CLKBIN) thereof is used to input the first clock signal (CLK), wherein the first clock signal (CLK) and the second clock signal (CLKB) are inverted signals with each other.

Figure 7:
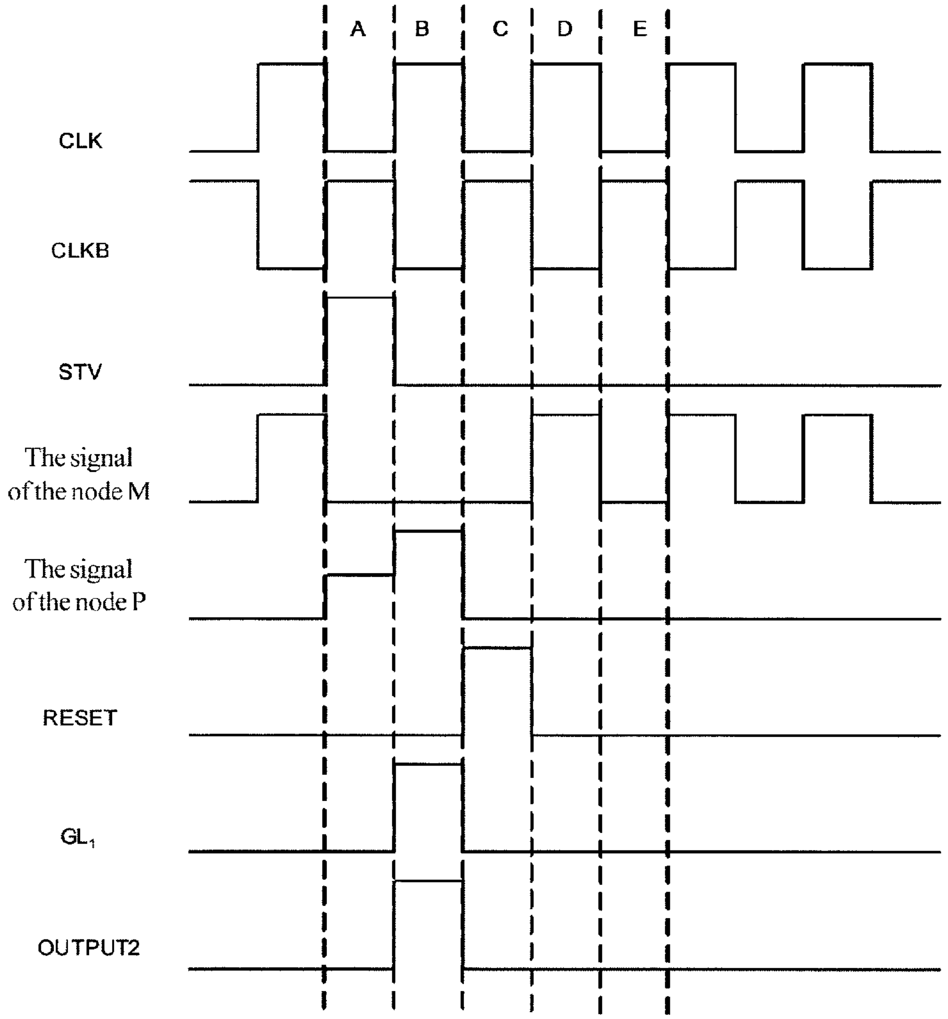
FIG. 7 is a timing chart for the input and output signals of the shift register unit as shown in FIG. 4.

FIG. 7 is a timing chart for the input and output signals of the shift register unit shown in FIG. 4. The start signal input terminal (STVIN) inputs the frame start signal (STV), the first clock signal input terminal (CLKIN) inputs the first clock signal (CLK), the second clock signal input terminal (CLKBIN) inputs the second clock signal (CLKB), the low level signal input terminal (VSSIN) inputs the low level signal (VSS), the reset signal input terminal (RESETIN) inputs a reset signal (RESET), the first signal output terminal (OUT) outputs the gate driving signal ($GL_1$), and the second signal output terminal (OUT2) outputs a control signal (OUTPUT2) for controlling the second shift register unit. The low level signal (VSS) is not shown in FIG. 7. The low level signal (VSS) is a signal which keeps at a low level at all times.

In the shift register unit shown in FIG. 4, a node P is formed where the gate of the third TFT T3, the gate of the first TFT T1, one terminal of the capacitor C1, the drain of the sixth TFT T6 and the source of the fifth TFT T5 converge. A node M is formed where the source of the ninth TFT T9, the source of the tenth TFT T10, the drain of the eleventh TFT T11, the gate of the sixth TFT T6 and the gate of the seventh TFT T7 converge. The timing at the node M along with timing at the node P is shown in FIG. 7.

In the following, the operation principle of the shift register unit provided by the present invention is illustrated in combination with FIG. 4, FIG. 5 and FIG. 7.

A part of the timing chart shown in FIG. 7 is selected, and 5 stages are selected therefrom and marked with A, B, C, D and E respectively.

At the stage A, the second clock signal (CLKB) is at a high level, the tenth TFT T10 is turned on. Since the first clock signal (CLK) is at a low level, the level of the node M is pulled down to the low level, and the sixth TFT T6 and the seventh TFT T7 are turned off. The frame start signal (STV) is at the high level, the fifth TFT T5 is turned on, and the level at the node P is pulled up to the high level, thus the first TFT T1 and the third TFT T3 are turned on. Since the second clock signal (CLKB) is at the high level and the eighth TFT T8 is turned on, the signal ($GL_1$) output by the first signal output terminal is at the low level. Since the first clock signal (CLK) is at the low level and the third TFT T3 is turned on, the signal (OUTPUT2) output by the second signal output terminal is at the low level. The charging voltage of the two terminals of the capacitor C1 is the difference between a level value of the high level and level value of the low level.

At the stage B, the reset signal (RESET) and the second clock signal (CLKB) are at the low level and the frame start signal (STV) is at the low level, thus the second TFT T2, the fifth TFT T5, the eighth TFT T8 and the tenth TFT T10 are turned off. Since the charge retain function of the capacitor C1, the level of the node P still keeps at the high level and the first TFT T1 and the third TFT T3 remain on. The first clock signal (CLK) is at the high level and the third TFT T3 is turned on, thus the signal (OUTPUT2) output by the second signal output terminal is at the high level and the eleventh TFT T11 is turned on. Since the first clock signal (CLK) is at the high level and the ninth TFT T9 is turned on but the eleventh TFT T11 is turned on as well, the level of the node M is pulled down to the low level and the sixth TFT T6 and the seventh TFT T7 are turned off. Since the first clock signal (CLK) is at the high level and the first TFT T1 is turned on but the second TFT T2 is turned off, the signal ($GL_1$) output by the first signal output terminal is at the high level.

In addition, at the stage B, due to the coupling function of the capacitor C1, the level of the node P is further pulled up to the difference between double of the level value of the high level and the level value of the low level, that is, the gate voltage of the first TFT T1 is increased and the on current of the first TFT T1 is increased, so that it is possible to make the gate driving signal ($G1_1$) output by the first signal output terminal (OUT1) become steep.

At the stage B, the gates of the first TFT T1 and the third TFT T3 are both connected to the node P and the drain of the first TFT T1 and the source of the third TFT T3 are both connected to the first clock signal input terminal (CLKIN), therefore, the signal (OUTPUT2) output by the second signal output terminal (OUT2) is the same as the signal ($GL_1$) output by the first signal output terminal (OUT1) and is at the high level as well. When the shift register unit is at the stage B, the next neighboring shift register unit is at the stage A, so that the signal (OUTPUT2) output by the second signal output terminal may just function as the frame start signal for the next neighboring shift register unit.

At the stage C, the frame start signal (STV) is at the low level and the fifth TFT T5 is turned off. The second clock signal (CLKB) is at the high level and the tenth TFT T10 is turned on. The first clock signal (CLK) is at the low level, the ninth TFT T9 is turned off, the level of the node M is pulled down to the low level, and the sixth TFT T6 and the seventh TFT T7 are turned off. The second clock signal (CLKB) is at the high level, the eighth TFT T8 is turned on, and the signal ($GL_1$) output by the first signal output terminal (OUT1) is at the low level. The second clock signal (CLKB) is at the high level, the fourth TFT T4 is turned on, and the signal (OUTPUT2) output by the second signal output terminal (OUT2) is at the low level.

In addition, at the stage C, the reset signal (RESET) is at the high level, the second TFT T2 is turned on, and the level of the node P is pulled down to the low level. The second TFT T2 being turned on further assures that the signal ($GL_1$) output by the first signal output terminal (OUT1) is pulled down to a low level reliably. Since the first signal output terminal (OUT1) is connected to gate lines on the array substrate and there is a relatively large parasitic capacitance, if the second TFT T2 is turned on, then the discharging of the parasitic capacitance may be speeded up, so that the signal ($GL_1$) output by the first signal output terminal (OUT1) is restored quickly to the low level.

At the stage D, the reset signal (RESET) is at the low level, the second TFT T2 is turned off, the second clock signal (CLKB) is at the low level, the tenth TFT T10 is turned off, and the eleventh TFT 11 is turned off. The first clock signal (CLK) is at the high level, the ninth TFT T9 is turned on, the level of the node M is pulled up to the high level, the sixth TFT T6 and the seventh TFT T7 are turned on, and the node P and the signal ($GL_1$) output by the first signal output terminal (OUT) are pulled down to the low level. Since the node P is at the low level, the third TFT T3 and the fourth TFT T4 are turned off and the signal (OUTPUT2) output by the second signal output terminal (OUT2) keeps at the low level.

At the stage E, the first clock signal (CLK) is at the low level and the ninth TFT T9 is turned off. The second clock signal (CLKB) is at the high level, the tenth TFT T10 is turned on, and the eighth TFT T8 is turned on. Since the first clock signal (CLK) is at the low level, the level of the node M is pulled down to the low level, and the sixth TFT T6 and the seventh TFT T7 are turned off. Since the eighth TFT T8 is turned on, the signal ($GL_1$) output by the first signal output terminal (OUT1) is at the low level. The second clock signal (CLKB) is at the high level, the fourth TFT T4 is turned on, and the signal (OUTPUT2) output by the second signal output terminal (OUT2) is pulled down to the low level. The frame start signal (STV) is at the low level, the fifth TFT T5 is turned off, the node P keeps at the low level, and the third TFT T3 and the fourth TFT T4 remain off.

After the stage E, the frame start signal (STV) keeps at the low level, the input and output timing signals of the shift register unit repeat the timing signals of the stages D and E, and with the first clock signal (CLK) and the second clock signal (CLKB) changing to the high level alternatively, the eighth TFT T8 and the seventh TFT T7 pull the signal ($GL_1$) output by the first signal output terminal (OUT1) down to the low level alternatively.

When the next high level of the frame start signal (STV) comes, the shift register unit repeats the timings of the stages A-E.

At the stages A, B and C as described above, the shift register unit outputs one gate driving signal such that the gate line connected to the first signal output terminal of the shift register unit controls one row of TFTs to be turned on, and the data signal of the source driving circuit of the LCD is input to a pixel electrode to charge the pixel electrode.

It can be seen by the introduction of the operation principle as described above that, in FIG. 3, the seventh TFT T7 and the eighth TFT T8 mainly play roles of pulling the level of the gate driving signal $GL_1$ down, and that it can be assured that the gate driving signal keeps at a low level reliably at the stage that the gate driving signal is needed to keep at the low level.

In the shift register unit shown in FIG. 4, the seventh TFT T7 and the eighth TFT T8 are not always turned on, instead, with the first clock signal and the second clock signal changing to the high level alternatively, the seventh TFT T7 and the eighth TFT T8 are turned on alternatively as well (see FIG. 7 in which the timings of CLKB and the node M change to the high level alternatively), so that the gates of the seventh TFT T7 and the eighth TFT T8 are under the function of one alternating current bias voltage other than the function of one direct current bias voltage, thereby the threshold voltages Vth of the seventh TFT T7 and the eighth TFT T8 are prevented from generating an excessively large offset.

Figure 8:
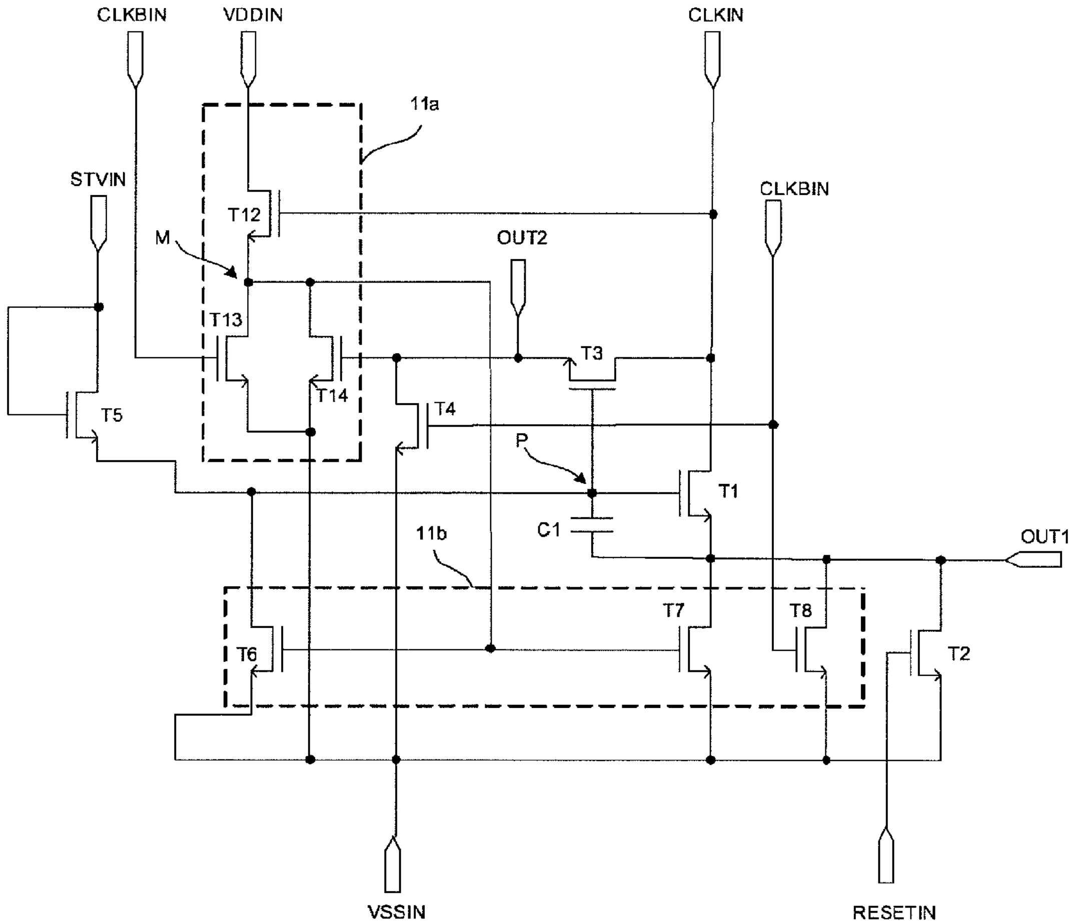
FIG. 8 is a structural schematic diagram for a fourth embodiment of a shift register unit of the present invention.

FIG. 8 is a structural schematic diagram for a fourth embodiment of a shift register unit of the present invention. In the embodiment, the structure of the driving unit is different from that of FIG. 3.

In the embodiment as shown in FIG. 8, the driving unit 11*a* includes a twelfth TFT T12, a thirteenth TFT T13 and a fourteenth TFT T14. The drain of the twelfth TFT T12 is connected to a high level signal input terminal (VDDIN) and the gate thereof is connected to the first clock signal input terminal (CLKIN). The high level signal input terminal (VDDIN) is used for inputting a high level signal (VDD) that may be one signal which keeps at a high level at all times, for example, may be one signal which keeps at +25V at all times.

The drain of the thirteenth TFT T13 is connected to the source of the twelfth TFT 112, the gate thereof is connected to the second clock signal input terminal (CLKBIN), and the source thereof is connected to the low level signal input terminal (VSSIN).

The drain of the fourteenth TFT T14 is connected to the source of the twelfth TFT T12, the gate thereof is connected to the source of the third TFT T3, and the source thereof is connected to the low level signal input terminal (VSSIN).

The pull-down unit 11*b* includes the sixth TFT T6, the seventh TFT T7 and the eighth TFT T8.

The gate of the sixth TFT T6 is connected to the source of the twelfth TFT T12, the drain thereof is connected to the source of the fifth TFT T5, and the source thereof is connected to the low level signal input terminal (VSSIN).

The drain of the seventh TFT T7 is connected to the first signal output terminal (OUT1), the gate thereof is connected to the source of the twelfth TFT T12, and the source thereof is connected to the low level signal input terminal (VSSIN).

The drain of the eighth TFT T8 is connected to the first signal output terminal (OUT1), the gate thereof is connected to the second clock signal input terminal (CLKBIN), and the source thereof is connected to the low level signal input terminal (VSSIN).

In the embodiment as shown in FIG. 8, by the twelfth TFT T12, the thirteenth TFT T13 and the fourteenth TFT T14, a signal which is changed alternatively with the second clock signal (CLKB) is generated at the node M, so that the seventh TFT T7 and the eighth TFT T8 pull the gate driving signal down alternatively at the stage of the gate driving signal being needed to keep at a low level and it is assured that the gate driving signal keeps at a low level reliably. Furthermore, it will not be resulted in that the threshold voltages Vth of the seventh TFT T7 and the eighth TFT T8 generate an excessively large offset.

Figure 9:
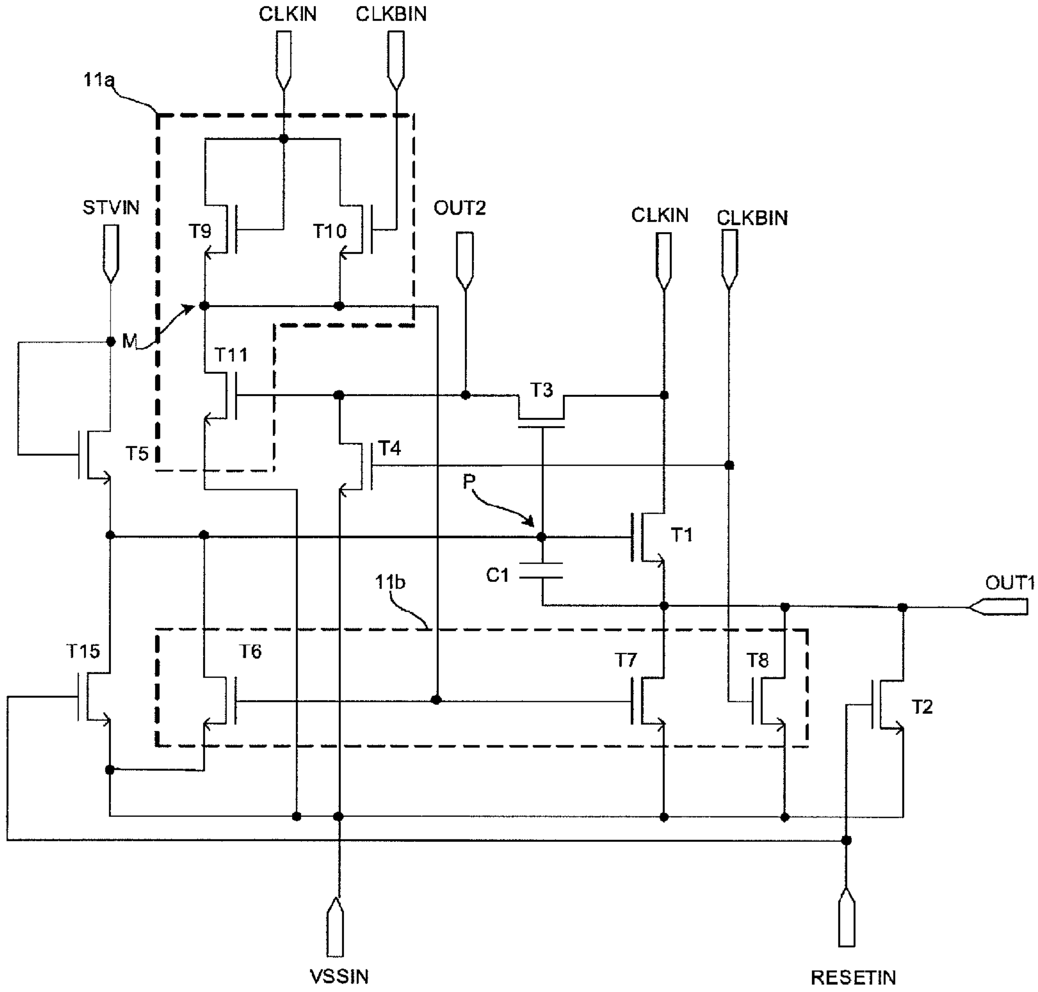
FIG. 9 is a structural schematic diagram for a fifth embodiment of a shift register unit of the present invention.

FIG. 9 is a structural schematic diagram for a fifth embodiment of a shift register unit of the present invention. The embodiment adds a fifteenth TFT T15 on the basis of the embodiment as shown in FIG. 3, the drain of which is connected to the source of the fifth TFT T5, the gate of which is connected to the reset signal input terminal (RESETIN) and the source of which is connected to the low level signal input terminal (VSSIN).

In the embodiment as shown in FIG. 9, the fifteenth TFT T15 is connected to the source of the fifth TFT T5, that is, is connected to the node P. Due to the coupling function of the capacitor, the level at the node P is pulled up to very high (See the timing shown in FIG. 7). By the fifteenth TFT T15, the charges at the node P may be discharged very quickly, so that the falling edge of the gate driving signal ($GL_1$) output by the first signal output terminal (OUT1) becomes steep.

The shift register unit as shown in FIG. 8 may also be added the fifteenth TFT T15 thereto, and the connection relationship between the fifteenth TFT T15 and other TFTs and respective input terminals is the same as that of FIG. 9.

In the respective embodiments of the present invention, the gate and the drain of the fifth TFT T5 are all connected to the start signal input terminal (STVIN), and when the input frame start signal (STV) is at the high level, it is equivalent to that the first TFT T1 is pre-discharged.

In the embodiment as shown in FIG. 9, the aspect ratios of respective TFTs may be as follows.

The first TFT T1: 1800 micron/4.5 micron; the second TFT T2: 800 micron/4.5 micron; the third TFT T3: 200 micron/4.5 micron; the fourth TFT T4: 100 micron/4.5 micron; the fifth TFT T5: 100 micron/4.5 micron; the sixth TFT T6: 300 micron/4.5 micron; the seventh TFT T7: 100 micron/4.5 micron; the eighth TFT T8: 200 micron/4.5 micron; the ninth TFT T9: 50 micron/4.5 micron; the tenth TFT T10: 200 micron/4.5 micron; the eleventh TFT T11: 200 micron/4.5 micron; the twelfth TFT T12: 200 micron/4.5 micron; the thirteenth TFT T13: 50 micron/4.5 micron; the fourteenth TFT T14: 200 micron/4.5 micron; and the fifteenth TFT T15: 200 micron/4.5 micron. Wherein, the aspect ratios of the first TFT T1, the second TFT T2, the sixth TFT 16, the seventh TFT T7 and the fifteenth TFT 115 may be adjusted larger depending on requirements so as to improve the driving abilities of these TFTs.

Wherein, the capacitance value of the capacitor C1 may be 0.3 Pico farad (pF).

In the LCD gate driving device provided by the present invention, the shift register unit may employ shift register units provided by the respective embodiments of the present invention, for example, may employ the shift register unit as shown in FIG. 1, FIG. 3, FIG. 4, FIG. 8 or FIG. 9.

The present invention also provides a LCD which may include the LCD gate driving devices of respective embodiments as described above. Respective TFTs in the LCD gate driving device may be deposited on the array substrate by using a production process similar with that of TFTs of the pixel area, and preferably may be deposited at the edge of the array substrate.

Finally, it should be noted that the above embodiments are only used to illustrate the technical solutions of the present invention but not limiting thereof. Although the detailed description is made to the present invention with reference to the above embodiments, those of ordinary skill in the art should understand that modification can be made to the technical solutions described in the respective embodiments as described above or equivalent replacement can be made to a part of technical features therein, and such modification or replacement do not make the essences of corresponding technical solutions depart from the spirit and the scope of the technical solutions of respective embodiments of the present invention.

What is claimed is:

1. A shift register unit, comprising:

a first thin film transistor, the drain of which is connected to a first clock signal input terminal and the source of which is connected to a first signal output terminal;

a second thin film transistor, the drain of which is connected to the first signal output terminal, the gate of which is connected to a reset signal input terminal, and the source of which is connected to a low level signal input terminal;

a third thin film transistor, the drain of which is connected to the first clock signal input terminal, the gate of which is connected to the gate of the first thin film transistor, and the source of which is connected to a second signal output terminal;

a fourth thin film transistor, the drain of which is connected to the drain of the third thin film transistor, the gate of which is connected to a second clock signal input terminal, and the source of which is connected to the low level signal input terminal;

a fifth thin film transistor, the gate and the drain of which are both connected to a start signal input terminal, and the source of which is connected to the gate of the first thin film transistor; and a capacitor, two terminals of which are connected to the gate and the source of the first thin film transistor respectively;

the first clock signal input terminal is used for inputting a clock signal; the second clock signal input terminal is used for inputting a clock signal inverted with respect to the signal input by the first clock signal; the reset signal input terminal is used for inputting a reset signal; the start signal input terminal is used for inputting a start signal; the low level signal input terminal is used for inputting a low level signal; the first signal output terminal is used for outputting a gate driving signal; and the second signal output terminal is used for providing a control signal for the next neighboring shift register unit.

2. The shift register unit according to claim 1, further comprising a pull-down module for controlling the level of the gate driving signal to be pulled down to a low level at the stage of the gate driving signal being needed to keep at the low level.

3. The shift register unit according to claim 2, wherein said pull-down module comprises a driving unit and a pull-down unit;

the driving unit is used for driving the pull-down unit to operate at the stage of the gate driving signal being needed to keep at the low level; and the pull-down unit is used for pulling the gate driving signal down to the low level under the control of the driving unit.

4. The shift register unit according to claim 3, wherein the driving unit comprises:

a ninth thin film transistor, the drain and the gate of which are connected to the first clock signal input terminal;

a tenth thin film transistor, the drain of which is connected to the first clock signal input terminal, the gate of which is connected to the second clock signal input terminal, and the source of which is connected to the source of the ninth thin film transistor; and an eleventh thin film transistor, the drain of which is connected to the source of the ninth thin film transistor and the source of the tenth thin film transistor, the gate of which is connected to the source of the third thin film transistor, and the source of which is connected to the low level signal input terminal; and the pull-down unit comprises:

a sixth thin film transistor, the drain of which is connected to the source of the fifth thin film transistor, the gate of which is connected to the source of the ninth thin film transistor, and the source of which is connected to the low level signal input terminal;

a seventh thin film transistor, the drain of which is connected to the first signal output terminal, the gate of which is connected to the source of the ninth thin film transistor, and the source of which is connected to the low level signal input terminal; and an eighth thin film transistor, the drain of which is connected to the first signal output terminal, the gate of which is connected to the second clock signal input terminal, and the source of which is connected to the low level signal input terminal.

5. The shift register unit according to claim 3, wherein the driving unit comprises:

a twelfth thin film transistor, the drain of which is connected to a high level signal input terminal and the gate of which is connected to the first clock signal input terminal;

a thirteenth thin film transistor, the drain of which is connected to the source of the twelfth thin film transistor, the gate of which is connected to the second clock signal input terminal, and the source of which is connected to the low level signal input terminal; and a fourteenth thin film transistor, the drain of which is connected to the source of the twelfth thin film transistor, the gate of which is connected to the source of the third thin film transistor, and the source of which is connected to the low level signal input terminal; and the pull-down unit comprises:

a sixth thin film transistor, the gate of which is connected to the source of the twelfth thin film transistor, the drain of which is connected to the source of the fifth thin film transistor, and the source of which is connected to the low level signal input terminal;

a seventh thin film transistor, the drain of which is connected to the first signal output terminal, the gate of which is connected to the source of the twelfth thin film transistor, and the source of which is connected to the low level signal input terminal; and an eighth thin film transistor, the drain of which is connected to the first signal output terminal, the gate of which is connected to the second clock signal input terminal, and the source of which is connected to the low level signal input terminal; and the high level signal input terminal is used for inputting a high level signal.

6. The shift register unit according to claim 4, further comprising a fifteenth thin film transistor, the drain of which is connected to the source of the fifth thin film transistor, the gate of which is connected to the reset signal input terminal, and the source of which is connected to the low level signal input terminal.

7. The shift register unit according to claim 5, further comprising a fifteenth thin film transistor, the drain of which is connected to the source of the fifth thin film transistor, the gate of which is connected to the reset signal input terminal, and the source of which is connected to the low level signal input terminal.

8. A liquid crystal display gate driving device, comprising n shift register units sequentially connected according to claim 1, wherein n is a natural number;

except for the first shift register unit and the n-th shift register unit, the second signal output terminal of each shift register unit is connected to the reset signal input terminal of the last neighboring shift register unit and the start signal input terminal of the next neighboring shift register unit;

the second signal output terminal of the first shift register unit is connected to the start signal input terminal of the second shift register unit; and the second signal output terminal of the final shift register unit is connected to the reset signal input terminal of the (n−1)-th shift register unit and the reset signal input terminal of itself.

9. The liquid crystal display gate driving device according to claim 8, wherein for an odd numbered shift register unit, the first clock signal input terminal thereof is used to input the first clock signal and the second clock signal input terminal thereof is used to input the second clock signal;

for an even numbered shift register unit, the first clock signal input terminal thereof is used to input the second clock signal and the second clock signal input terminal thereof is used to input the first clock signal; and the first clock signal and the second clock signal are inverted signals with each other.

10. A liquid crystal display, comprising the liquid crystal display gate driving device according to claim 8.

* * * * *